United States Patent [19]

Gruchalla et al.

[11] Patent Number: 4,797,628

[45] Date of Patent: Jan. 10, 1989

[54] DISTRIBUTED PUSH-PULL AMPLIFIER

[76] Inventors: Michael E. Gruchalla, 4816 Palo Duro, NE, Albuquerque, N. Mex. 87110; David C. Koller, 4522 Idlewilde Ln. SE, Albuquerque, N. Mex. 87108

[21] Appl. No.: 173,062

[22] Filed: Mar. 23, 1988

[51] Int. Cl.[4] ............................ H03F 3/60; H03F 3/28
[52] U.S. Cl. .................................... 330/54; 330/118; 330/286
[58] Field of Search .................. 330/53, 54, 55, 118, 330/262, 286

[56] References Cited

U.S. PATENT DOCUMENTS

| 2,018,320 | 10/1935 | Roberts | 178/44 |
| 2,930,986 | 3/1960 | Kobbe et al. | 330/54 |
| 3,571,742 | 3/1971 | Wegenroth | 330/54 |
| 4,337,439 | 6/1982 | Sosin | 330/54 |

FOREIGN PATENT DOCUMENTS 1133653  1/1985  U.S.S.R. ............................. 330/54

Primary Examiner—Steven Mottola
Attorney, Agent, or Firm—Karla Ojanen

[57] ABSTRACT

The present invention provides a modified distributed amplifier which is capable of providing push-pull operation without the loading losses of conventional push-pull combining. The modified distributed amplifier comprises a distributed amplifier configuration and with signal inverting means, such as a wide bandwidth transmission line transformer, interconnected into both the input and output lines. The signal inverting means are most effectively placed at the electrical centers of the lines, but may be placed at any positions in the individual lines to produce optimum performance to specific applications. The separate segments of the distributed amplifier separated by the signal inverting means operate in opposed phase but the signals output to the load add in phase thus providing push-pull operation. Since only one reverse terminating resistor is required, the power normally lost due to the loading by the companion amplifier of a conventional push-pull combined distributed amplifier system is instead delivered to the output load, the use of this type of amplifier preserves the advantages of the distributed amplifier configuration while providing the superior performance of the push-pull configuration but without the losses normally incurred with conventional push-pull combining.

14 Claims, 6 Drawing Sheets

DISTRIBUTED PUSH-PULL AMPLIFIER

FIELD OF THE INVENTION

The present invention relates to a linear electronic amplification system. More particularly, the invention relates to a system for providing higher efficiency, lower distortion, and higher power in a distributed amplifier, singly or several in combination.

BACKGROUND OF THE INVENTION

For many electronic amplifier applications, it is necessary that the amplifier assembly have wide bandwidth as well as high output power and low signal distortion. For example, in the field of radio-frequency transmission where low-level radio-frequency signals are amplified by wide bandwidth linear amplifiers of the distributed type. The amplified signals are then applied to antenna assemblies for aerial radiation. In these applications, the output power available from the amplifier must be sufficient to assure that the desired radiated field is achieved. Low distortion, moreover, is required to assure that the spectral components of the input signal are unmodified in the amplification process. But, typical amplifier configurations capable of providing the required wide bandwidth and power, such as the distributed amplifier, also introduce objectionable distortion.

A distributed amplifier is an amplifier system comprising a number of individual amplifying devices, such as vacuum tubes or solid-state devices. The input terminal of each amplifying device is connected to an input line, and, correspondingly, the output terminal of each amplifying device is connected to an output line. The input and output lines of the distributed amplifying system are so designed as to be lumped-element transmission lines utilizing the parasitic reactive elements, capacitance and inductance, of the individual amplifying devices as part of the lumped parameters of these lines. Lumped-element transmission lines are well known in the art and are described in, for instance, U.S. Pat. No. 2,018,320, entitled "Radio Frequency Transmission Line," to Roberts. Lumped-element transmission lines applied to amplifiers are also described in the prior art in, for instance, U.S. Pat. No. 2,930,986, entitled "Distributed Amplifier," to Kobbe et al. In the distribution amplifier, the input signal to each successive amplifying device is delayed by the delay of the input line, and the delay of the output line is designed to be identical to that of the input line. This configuration results in each amplifying device delivering its output signal in phase with that of the other amplifying devices thereby providing maximum output signal delivered to the load. In effect, the collection of individual amplifying devices operate in parallel. However, if the amplifying devices were simply connected in parallel, the parasitic elements, most particularly the input and output capacitances respectively, would combine in parallel severely reducing the system bandwidth below that available from a single amplifying device. By including the amplifying devices in a distributed amplifier configuration, the effects of the parasitic elements of the amplifying devices do not add, and the bandwidth of a single amplifying device is preserved in the complete distributed amplifier system.

In the basic distributed amplifier of the prior art, the operating phase of each amplifying device is the same with respect to the output, i. e., a positive-going signal at the output terminal of the amplifier system is the result of a positive-going signal at each amplifying device output. Typically, the amplifying device produces an output signal that is asymmetric about the quiescent operating point, for example, the positive output signal component is somewhat lower in magnitude than the negative output signal component. This asymmetry is common in Class A operation of amplifying devices such as vacuum tubes, and is very distinct in operating classes of Class AB, Class B and Class C where the amplifying devices do not amplify the input signal over the complete input cycle. Such asymmetry results in distortion of the output signal in the basic distributed amplifier of the prior art.

Distortion in distributed amplifier systems results from the inherent parallel operation of the individual amplifying devices. Operation of a pair of amplifiers in a push-pull configuration is well known in the art as a means of reducing signal distortion. A push-pull distributed amplifier system is described in U.S. Pat. No. 4,337,439, entitled "Wide Band Amplifiers," to Sosin. The distributed amplifier system as taught by Sosin is composed of two individual distributed amplifiers connected in a standard push-pull configuration, i. e., two substantially similar amplifiers are interconnected at their input using a tapped transformer, and interconnected at their output using a second tapped transformer. Each amplifier must drive the parallel combination of the load and the output impedance of the companion amplifier. This typical push-pull configuration results in significant loading of each amplifier by the companion amplifier which reduces the power available for delivery to the load. Additionally, the required tapped transformers contained in the prior art by Sosin cannot be effectively fabricated in a manner provided wide-bandwidth performance and therefore introduce significant losses and frequency limitations. The configuration of the prior art by Sosin thus additionally results in severe bandwidth limitations over the basic distributed amplifier configuration. Since wide-bandwidth performance and maximum power delivered to the load are principle features of a distributed amplifier, a configuration inherently reducing bandwidth and delivered power is undesirable.

The present invention is significantly different from push-pull distributed amplifiers of the prior art as that taught by Sosin and referenced herein above. The present invention eliminates the companion amplifier loading and allows the required inverting means necessary for push-pull operation to be fabricated and installed in a manner consistent with wide-bandwidth performance.

Another variation of a push-pull amplifier in the prior art is described in U.S. Pat. No. 3,571,742, entitled "Push-Pull Distributed Amplifier," to Wengenroth. The amplifier as taught by Wengenroth is composed of several substantially standard push-pull amplifiers interconnected to input and output lumped-element transmission lines of a distributed amplifier configuration. The two individual amplifying devices in the individual amplifier stages in the configuration by Wengenroth are connected at their inputs by means of a center-tapped inductor. This center-tapped inductor is effectively an auto-transformer, i. e., a signal is applied to one-half of the total winding and signal is extracted from the total winding. The auto-transformed action thus provides equal magnitude and opposed phase input signals to the two individual amplifying devices of each individual amplifier as is common in the art of a standard push-pull amplifier. Similarly, the outputs of the two amplifying devices of each individual amplifier in the configuration by Wengenroth are combined in a center-tapped inductor, also effectively an auto-transformer. Thus, each individual amplifier stage in the configuration by Wengenroth is a substantially standard push-pull amplifier: two substantially similar amplifying devices interconnected at their inputs using a tapped transformer, and interconnected at their outputs using a second tapped transformer. A disadvantage of this configuration by Wengenroth is that the parasitic elements, particularly input and output capacitance, of the two individual amplifying devices comprising each amplifying stage are effectively connected in parallel causing a reduction in bandwidth over that available from a single amplifying device. Another disadvantage of the configuration by Wengenroth is that the auto-transformer configuration of the input and output tapped inductors results in an electrical configuration of poor electrical symmetry due to the additional parasitic elements introduced by the auto-transformer. Thus, the source impedance driving the two input terminals of the two individual amplifying devices are not equal, and similarly the output impedance presented to the two output terminals of those amplifying devices are not equal. Such asymmetry results in poor performance over frequency and reduces the wide-bandwidth capability of the distributed amplifier system. A further disadvantage of the amplifying system by Wengenroth is that the required tapped inductors cannot be fabricated in a manner providing wide-bandwidth performance. For example, the tapped inductors cannot be fabricated with a well defined broadband characteristic impedance, such as 50 ohms or 100 ohms, since such impedance would present loading in both the input and output lines of the overall distributed amplifier system. That loading would make it impossible to properly effect lumpedelement input and output transmission lines of low-loss, wide-bandwidth performance as is necessary for operation of the distributed amplifier configuration. Still another disadvantage of this configuration is that input and output tapped inductors are needed for each amplifying stage. The physical size of these tapped inductors and the required position in the circuit introduce additional parasitic elements (capacitance and inductance) that severely limits the bandwidth and the total number of stages that may effectively included in the distributed amplifier system. The principle advantage of the distributed amplifier configuration is the effective use of many individual amplifying stages to provide higher output power than each single stage while preserving the bandwidth available from a single amplifying stage. Therefore, the configuration taught by Wengenroth does not allow the principle value of the distributed amplifier to be realized.

The present invention provides an improved pushpull distributed amplifier system in which individual amplifying devices are arranged in two or more groups. The amplifying devices within each group operate in phase and groups of amplifying devices operate 180 degrees out-of-phase with means included for signal inversions required for accurate in-phase adding of the output signals of each group. The means utilized in the present invention for providing the required signal inversions may be fabricated with very well-defined, low-loss, broad-band characteristics accurately matching both the characteristic impedance and bandwidth performance of the input and output transmission lines of the distributed amplifier configuration. One such construction of the signal inverting means is that of a transformer wound with high-quality transmission line of the impedance required to match the signal line to which it is to be applied.

The present invention is substantially different from distributed amplifiers of the prior art as taught by Wengenroth and references herein above. By Wengenroth, a plurality of substantially standard push-pull amplifiers are utilized as the individual amplifying elements of a distributed amplifier configuration. Thus, by Wengenroth, push-pull operation is provided in each of the individual amplifying devices of a distributed amplifier configuration. In contrast, in the present invention configured with more than one distributed amplifier, a plurality of individual distributed amplifiers are combined by the substance of the invention to effect push-pull operation.

The present invention may also be applied to a single distributed amplifier. A configuration of a single distributed amplifier with only two amplifying devices and further configured according to the present invention may be compared to the individual amplifying stage by Wengenroth. The individual stage by Wengenroth is electrically a generally standard push-pull configuration suffering the disadvantages as previously reviewed herein above. In contrast, the present invention configured with a single distributed amplifier of only two individual amplifying devices fully retains the electrical properties of the basic distributed amplifier configuration. Therefore, the present invention effectively incorporates the parasitic elements of both the amplifying devices and the signal inverting devices in very well-defined and properly terminated transmission line structure which preserve the very broad bandwidth performance of the distributed amplifier and in addition provides push-pull operation. Thus, the present invention over Wengenroth, applied to a distributed amplifier with as few as two amplifying devices, retains all of the advantages of the distributed amplifier configuration while providing the added advantages of push-pull operation.

This improved configuration provides push-pull operation in a distributed amplifier configuration without compromise of output power and bandwidth inherently introduced by configurations of the prior art. Further, the number of amplifying devices that may be effectively employed and the frequency performance of the basic distributed amplifier is not compromised by use of this improved configuration. This allows the full benefit of the distributed amplifier configuration to be realized. The phase-opposed operation of the various amplifying devices with accurate in-phase addition of their output signals at the output terminal of a distributed amplifier configuration as embodied herein is a novel push-pull configuration which provides lower distortion, higher output power, and thus higher efficiency. Moreover, because of the unique push-pull configuration of the present invention, some of the power previously lost due to loading by the companion amplifier, as taught in the prior art, is made available to the load. The present invention thus provides as much as a factor of two improvement in the output power available from a distributed amplifier as taught in the prior art. By providing higher available output power, the present invention provides lower distortion for any specific output power. It is well known that distortion increases when an amplifier is driven to its maximum output capabilities. Since the amplifier of the present invention, for any specific delivered output power, operates at lower power level with respect to its maximum capabilities than an amplifier of the prior art composed of a similar number of amplifying devices, the present invention will provide lower distortion. Further, for any specific desired maximum output power, the electrical size of the amplifiers of the present invention may be reduced by a factor of as much as two over the electrical size of the amplifiers required in the prior art. The input quiescent operating power of the present invention is therefore reduced over the prior art for an amplifier configuration capable of a specific maximum output power. The reduced amplifier quiescent operating power of the present invention therefore provides increased efficiency. The present invention also provides reduced cost over the prior art for an amplifier of specific maximum output power capability because the cost and the electrical size of the amplifier are directly related.

SUMMARY OF THE INVENTION

Accordingly, it is an object of the invention to provide a push-pull distributed amplifier system which corrects for asymmetric output signal strengths.

Another object of the invention is to diminish power losses resulting from driving parallel combinations of load and output impedance occurring in previous push-pull distributed amplifier systems.

Another object of the present invention is to further reduce the power losses and frequency limitations associated with the required combining elements of typical push-pull distributed amplifier systems.

Another object of the present invention is to provide push-pull operation in a single distributed amplifier.

Another object of the present invention is to provide push-pull combining of two or more distributed amplifiers.

Further objects of the present invention are to provide improved distortion performance, higher efficiency, and higher output power by means of a novel push-pull distributed amplifier arrangement.

Additional objects and advantages of the present invention will be set forth in part from the description that follows and, in part, will be obvious from the description or learned by practice of the invention. The objects and advantages of the invention may be realized and obtained by the methods and apparatus particularly pointed out in the appended claims.

The present invention achieves the objects set forth above by means of a novel push-pull arrangement of the individual amplifying means of a distributed amplifier.

Specifically, to achieve the objects and in accordance with the purpose of the invention, as broadly described herein, the invention provides a push-pull distributed amplifier comprising: a distributed amplifier incorporating two or more amplifying means; a signal inverting means interconnected into the input line between at least one pair of adjacent amplifying means providing an input stimulus to one or more amplifying means that is phase-opposed to that input; a signal inverting means interconnected into the output line between at least one pair of adjacent amplifying means providing in-phase combining of the in-phase and phase-opposed components in the output circuit; and signal delay means, as required, in the input and output circuits to provide required signal delay in both the input and output circuits. The present invention may be applied with any operating class including Class A, Class AB, Class B, and Class C and with all class of operation provides improved performance over that provided by the prior art.

The accompanying drawings, which are incorporated in and constitute a part of the specification, illustrate a presently preferred embodiment of the invention and, together with the description, serve to explain the principles of the invention.

DESCRIPTION OF THE PREFERRED EMBODIMENT

Figure 1:
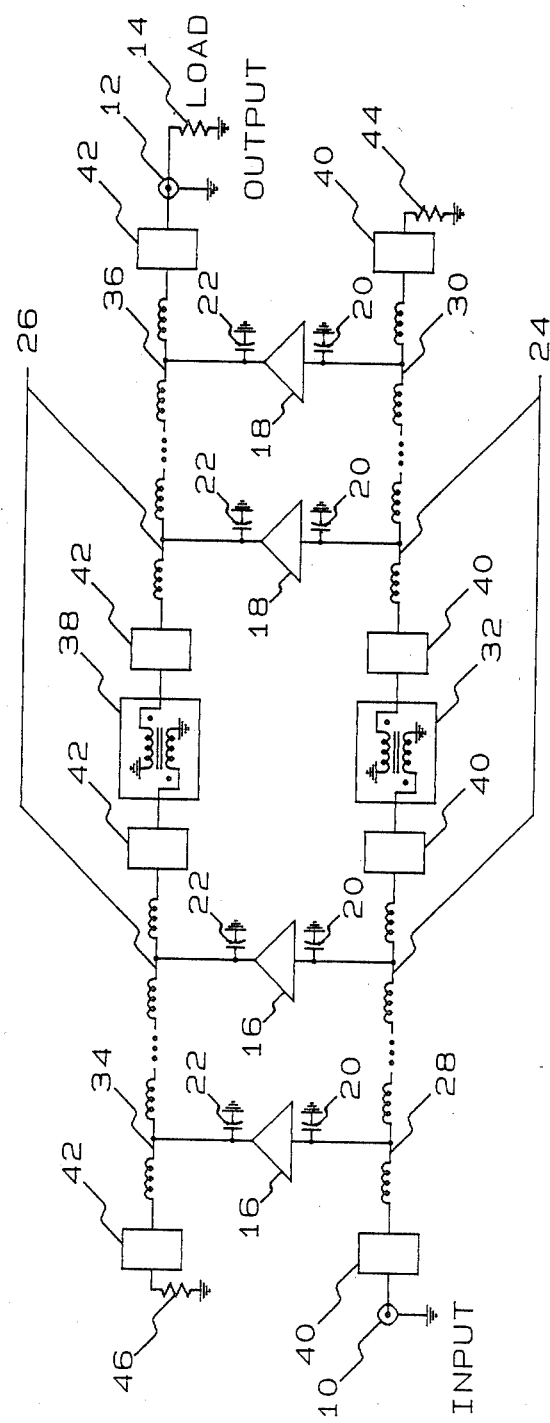
FIG. 1 is a schematic diagram showing a push-pull distributed amplifier system according to the present invention.

Reference will now be made in detail to a presently preferred embodiment of the invention, an example of which is illustrated in FIG. 1 of the included drawings. The purpose of the amplifier of the invention is to amplify an electrical signal applied at the amplifier input 10 and to deliver the amplifier signal to the output terminal 12 and in turn to a load 14 connected thereto. The load 14 may be any desired entity to which it is desired to deliver signal power. The impedance of load 14 may be resistive, complex, or totally imaginary. Examples of typical loads include, but are not limited to, an antenna for aerial radiation, coupling devices for magnetic resonance imaging, and the induction coils of an induction heating system. The basic amplifier system is of the distributed type and comprised of a plurality of amplifying devices 16 and 18. Each of the amplifying devices 16 and 18 may be an individual device, example types of which are common in the art include a vacuum tube, or a solid-state device such as a Field-Effect Transistor or Bipolar Transistor. Further, each amplifying device 16 and 18 may be comprised of a plurality of components such that each amplifying device 16 and 18 individually comprises a substantially complete amplifier. For example, several vacuum tubes may be configured together in a circuit to form a generally conventional multi-stage vacuum-tube amplifier, and then in turn applied as the individual amplifying device 16 and 18 in the present invention. Also, each of the amplifying devices 16 and 18 is unique and independent with respect to all other amplifying devices 16 and 18. Amplifying devices 16 and 18 may all be of an identical type, or each of a different type, or a combination of several identical types and several different types. At least one amplifying device 16 and at least one amplifying device 18 must be included in the amplifier system of the present invention.

The invention may be applied both to low-power applications and to very high-power applications. For example, the present invention may be applied using a number of small-signal Field-Effect Transistors to provide increased output power over that of a single Field-Effect Transistor while preserving wide-bandwidth performance. Similarly, the invention may be applied using a number of high-power vacuum tubes also providing higher output power over that of a single vacuum tube while preserving wide-bandwidth performance. The invention may be applied equally effectively in applications requiring milliwatts of delivered power and those requiring many kilowatts of delivered power. Further, the invention may be applied with any operating class of the individual amplifying devices 16 and 18. For example, the individual amplifying devices may be operated in, but not limited to, Class A, Class AB, Class B, and Class C. The bandwidth performance is determined primarily by the specific characteristics, such as cutoff frequency, of the individual amplifying devices 16 an 18. Bandwidths in excess of several hundred megahertz are provided with suitable amplifying devices 16 and 18, example types of which are a broad bandwidth Field-Effect Transistor or broad bandwidth vacuum tube.

The capacitor 20 is the parasitic input capacitance of each amplifying device 16 and 18. The capacitor 22 is the parasitic output capacitance of each amplifying device 16 and 18. Whereas the amplifying devices 16 and 18 need not be identical, the input parasitic capacitances 20 need not be identical and similarly the output parasitic capacitances 22 need not be identical. An input transmission line 24 and an output transmission line 26 are constructed incorporating the parasitic components 20 and 22 of the amplifying devices 16 and 18 in lumped-element transmission-line configurations as is common in the art of distributed amplifiers. Such a lumped-element transmission line is well known in the art and comprises a combination of individual "lumped" components, such as the output capacitance of amplifying devices 16 and 18, included in an electronic circuit configuration providing performance similar to a "distributed" element transmission line, such as a coaxial cable, for specific design bandwidths. The operation of the lumped-element transmission line is well known in the art and a further detailed description of operation of the basic lumped-element transmission line will not be herein repeated. The input line 24 is comprised of two transmission-line segments 28 and 30 interconnected by signal inverting transformer 32. The output line 26 is comprised of two transmission-line segments 34 and 36 interconnected by signal inverting transformer 38. Matching networks 40 in the input line 24 and matching networks 42 in the output line 26 provide impedance matching at the ends of the transmission-line segments 28, 30, 34 and 36 as is common in the art of lumped-element transmission line construction. The matching networks 40 and 42 include inductive, capacitive, and resistive components that provide broad-band impedance matching at the ends of lumped-element transmission lines. Whereas the amplifying devices 16 and 18 need not be identical, the matching networks 40 need not be identical and similarly the matching networks 42 need not be identical. The signal inverting transformers 32 and 38 are so constructed as to provide the signal delay and bandwidth required. A transmission-line transformer comprised of a length of transmission line, such as coaxial cable or parallel wire transmission line, formed about a core with each conductor comprising one winding is one such suitable construction of the signal inverting transformers 32 and 38 providing broad-band performance. Since the signal inverting transformers 32 and 38 may be manufactured and installed with very well defined and matched impedance characteristics and with very low-loss, broad-band performance, the addition of the signal inverting transformers 32 and 38 to the input and output transmission lines 24 and 26 respectively will not reduce the bandwidth or available output power of the basic distributed amplifier. Alternately, in applications where very wide-bandwidth performance is not required, a conventional transformer comprised of primary and secondary windings formed about a core may be used as the signal inverting transformers 32 and 38. The distributed amplifier is so termed because the amplifying devices are distributed along the input and output transmission lines 24 and 26 respectively. Since the operating principles of distributed amplifiers are well known in the art, a further detailed description of the operation of the basic distributed amplifier will not be herein repeated. As referenced herein, a distributed amplifier is understood to be an amplifier comprised of a plurality of amplifying devices each with an input connected to an input line and an output connected to an output line and further where the input and output lines are constructed utilizing the parasitic elements of the amplifying devices, matching elements, delay elements, terminating elements, and connecting elements providing the broad bandwidth transmission-line configuration for the input and output lines required for proper operation of a distributed amplifier.

The signal inverting transformer 32 may be interconnected in the input line 24 between any pair of adjacent amplifying devices 16 and 18. Similarly, signal inverting transformer 38 may be interconnected in the output line 26 between any pair of adjacent amplifying devices 16 and 18. The signal inverting transformers 32 and 38 would generally be interconnected between the same pair of amplifying devices 16 and 18, but may be interconnected between uniquely different amplifying devices 16 and 18 providing performance needed in applications that will become apparent by practice of the invention. Positioning of the signal inverting transformers 32 and 38 between different amplifying devices 16 and 18 provides a practical means of producing a desired amount of selective distortion of the amplified signal. One such application where selective distortion would be useful would be in the amplification of an input signal containing some asymmetry. The signal inverting transformer 32 may be positioned in the input line 24 and the signal inverting transformer 38 may be positioned in the output line 26 in a manner that produces a controlled asymmetry in the gain characteristic of an amplifier system of the present invention. That controlled asymmetry may be introduced in such a manner that it compensates for the asymmetry of the input signal thereby minimizing distortion in the output signal delivered to the load 14. Since a large number of amplifying devices 16 and 18 may be included in the present invention, and since one or more signal inverting transformers 32 and one or more signal inverting transformers 38 may also be included, the present invention provides accurate control of such selective distortion. When signal inverting transformers 32 and 38 are interconnected between the same pair of amplifying devices 16 and 18, the number of amplifying devices 16 may be equal to or different from the number of amplifying devices 18. Balanced performance where positive input signal components and negative input signal components are amplified substantially equally is obtained when signal inverting transformers 32 and 38 are interconnected between the same pair of amplifying devices 16 and 18 and the number of amplifying devices 16 equals the number of amplifying devices 18.

An input signal applied at input terminal 10 travels through input line segment 28 successively delivering input signal in turn to each amplifying device 16 connected to input line segment 28 as is common in the art of distributed amplifiers. The input signal is inverted by signal inverting transformer 32. The inclusion of signal inverting transformer 32 in the input line 24 is novel to the art of distributed amplifiers. The inverted input signal is applied to input line segment 30 where the inverted input signal is successively delivered in turn to each amplifying device 18 connected to the input line segment 30. The input signal is finally delivered to input line termination 44 as is common in the art of distributed amplifiers to prevent detrimental signal reflections in the input line 24. Since the input transmission line 24 is so designed as to operate as a transmission line, a terminating resistance 44 properly terminates the input transmission line 24 providing broad-bandwidth performance. For example, a typical impedance for the input line 24 would be 50 ohms, and the matched terminating resistance 44 would than be 50 ohms. A value of terminating impedance may also be chosen that mismatches the line to which it is applied to provide specific performance, for example, peaking of the gain at specific frequencies.

The output signals of amplifying devices 16 connected to output line segment 34 sum together in phase to form a single combined signal in the output line segment 34. A portion of the combined signal in the output line segment 34 is applied to signal inverting transformer 38. That signal portion is inverted by signal inverting transformer 38 and is applied to output line segment 36 and travels through output line segment 36 to the output terminal 12 and the load 14 attached thereto. Output line segment 36 acts as a simple transmission line for the signal components from output line segment 34. The inclusion of signal inverting transformer 38 in the output line 26 is novel in the art of distributed amplifiers. The output line 26 is reverse terminated by reverse termination 46 as is common in the art of distributed amplifiers to prevent detrimental signal reflections from portions of the combined output signal in the output line 26 that are applied to the output line reverse termination 46. The termination performance of termination resistor 46 to output line 26 is similar to that provided by termination 44 to input line 24 as described herein above. A portion of the combined signal of amplifying devices 16 delivered to line segment 34 is communicated to output line reverse termination 46.

The output signals of amplifying devices 18 connected to output line segment 36 sum together in phase to form a single combined signal in the output line segment 36. A portion of the combined signal in the output line segment 36 is applied to the output connector 12 and load 14 connected thereto. A portion of the combined signal in output line segment 36 is communicated to the output line reverse termination 46 through signal inverting transformer 38 and output line segment 34. Signal inverting transformer 38 and output line segment 34 act as a simple transmission line for signal components from output line segment 36 communicated to the reverse termination 46.

The input signal inverting action of signal inverting transformer 32 in the input line 24 causes the output signal component of amplifying devices 18 delivered to line segment 36 to be inverted with respect to the output signal component of amplifying devices 16 delivered to output line segment 34. Therefore, when the signal of output line segment 34 is inverted by signal inverting transformer 38 in the output line 26, the two components of output signal delivered to output terminal 12 partly from output line segment 36 and partly from output line segment 34 inverted by signal inverting transformer 38, combine in phase delivering a maximum combined output signal to the load 14.

Since the input signal applied to the amplifying devices 18 is inverted with respect to the input signal applied to amplifying devices 16, the amplifying devices 18 operate phase-opposed to amplifying devices 18 are being driven so as to source current to output line segment 36, amplifying devices 16 are being driven so as to sink current from line segment 34. Thus, positive output drive is delivered to the load 14 in part from amplifying devices 18 being driven so as to deliver positive drive to output line segment 36, and in part from amplifying devices 16 being driven so as to deliver negative drive to output line segment 34. Since signal inverting transformer 38 provides the phase-opposed signals in output line segments 34 and 36 to combine in phase at the output terminal 12, the load 14 attached to the output terminal 12 is driven in a push-pull manner.

There are many variations and combinations that may be applied to the present invention, and the invention is intended to encompass all such modifications and variations as fall within the scope of the appended claims. Several of such variations are described herein below. Since the present invention allows the use of many individual amplifying devices 16 and 18, modifications of the connections of the amplifying devices 16 and 18 to the input line 24 and output line 26 may be made to optimize performance in specific applications. For example, the embodiment of FIG. 1 is shown with the inputs of all amplifying devices 16 connected to input line segment 28 and inputs of all amplifying devices 18 connected to input line segment 30. Alternately, the input of one or more amplifying devices 16 may be connected instead to input line segment 30. Similarly, the input of one or more amplifying devices 18 may be connected instead to input line segment 28. In a similar manner, the outputs of one or more amplifying devices 16 and 18 may be cross-coupled to output line segments 34 and 36. Such cross-coupling of the inputs and outputs of one or more amplifying devices 16 and 18 will provide a desired amount of selective distortion of the amplified signal as referenced herein above.

For simplicity, the embodiment of FIG. 1 is shown with a single signal inverting transformer 32 in the input line 24 and a single signal inverting transformer 38 in the output line 26. Alternately, with reference to FIG.

1, substantially similar operation may be obtained with multiple signal inverting transformers 32 included in the input line 24 and interconnected between various amplifying devices 16 and 18. Multiple signal inverting transformers 38 may also be included in output line 26 and interconnected between various amplifying devices 16 and 18. The the electrical placement of and the number of signal inverting transformers 32 would normally be equal to the electrical placement of and the number of signal inverting transformers 38, but the placement and number of signal inverting transformers 32 and 38 may be made unequal to provide performance needed in applications that will become apparent by practice of the invention, such as correction of asymmetry of an input signal as referenced herein above. Since the signal inverting transformers 32 and 38 may be manufactured with well-defined impedance characteristics and low-loss broad-band performance, the use of multiple signal inversion transformers will not adversely compromise the wide bandwidth performance of the basic distributed amplifier. However, since the signal inverting transformers 32 and 38 will exhibit some finite loss, the use of several signal inverting transformers will reduce the output power available to the load from that available with a single signal inverting transformer 32 and single signal inverting transformer 38.

Figure 2:
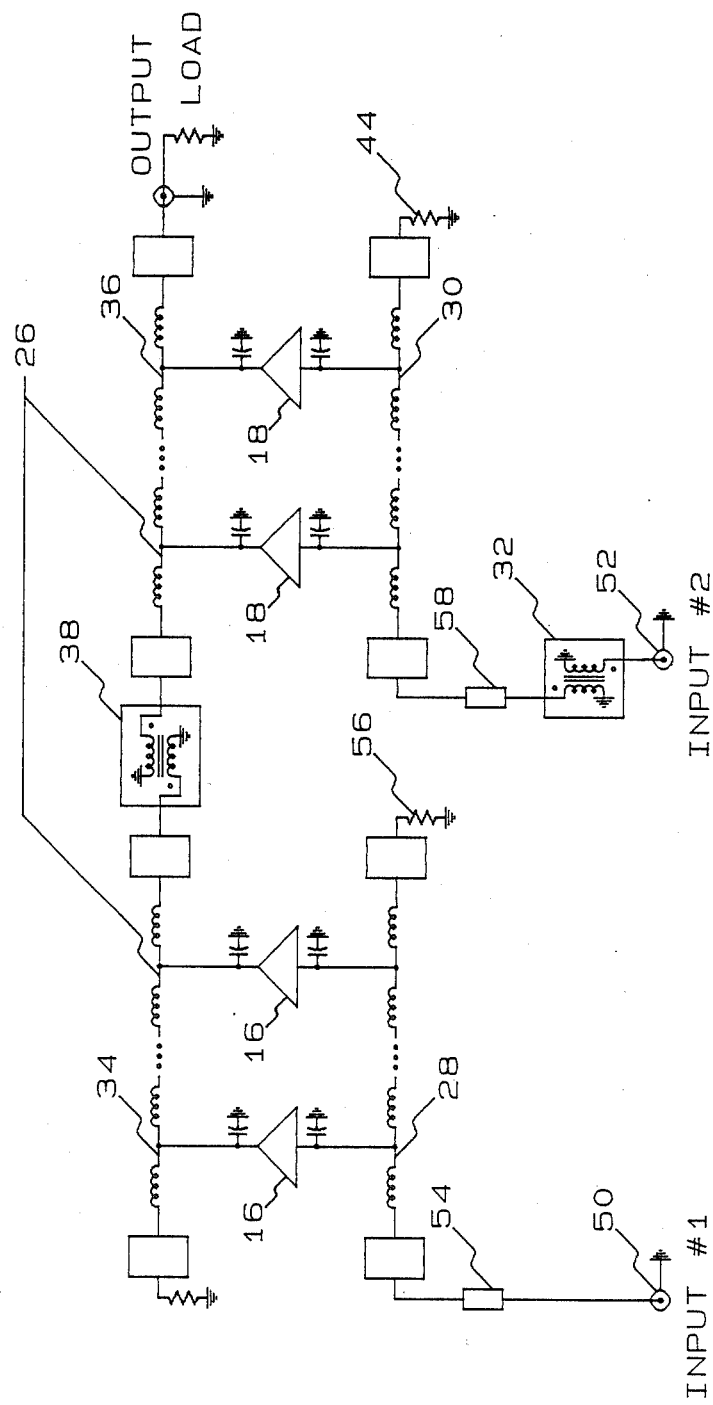
FIG. 2 is a schematic diagram showing a variation of the push-pull distributed amplifier system of the present invention utilizing two independent input lines.

It is apparent to one skilled in the art that the embodiment of FIG. 1 may be altered so as to include several independent input lines. The number of input lines that may be included is equal to the total number of amplifying devices 16 and 18. each input line would require an input signal. The required input signals may be provided by several different means. For example, a suitable preamplifier system with multiple outputs of the required phase and signal inversion may be used to provide the needed multiple input signals. Alternately, the required number of input signals may be provided from a single input signal by means of a suitable signal divider with input signal inverting transformers and input signal delay devices included providing the required signal inversion and signal delay. An embodiment according to the invention is shown in FIG. 2 of the included drawings comprising two independent input lines. With reference to FIG. 2, input signals are applied to two input terminals 50 and 52. These two input signals would normally be identical but may made different to provide performance needed in applications that will become apparent by practice of the invention. Input signal applied to input terminal 50 is communicated through signal delay 54, an example type of which is a suitable length of coaxial cable, to input line segment 28 and delivered to each amplifying device 16 in turn. Line segment 28 is forward terminated by forward termination 56 to form a complete and independent input line feeding amplifying devices 16. Input signal applied to input terminal 52 is communicated through signal inverting transformer 32 and signal delay 58 to line segment 30 and is delivered to each amplifying device 18 in turn. Input line segment 30 is forward terminated by termination resistor 44 to form a second complete and independent input line feeding amplifying devices 18. Signal delay 54 and 58 allow compensation of inherent signal delays to provide proper in-phase summing of the output signal components at output terminal 12 and load 14 connected thereto. Input signal inverting transformer 32 provides signal inversion of the input signal applied to amplifying devices 18 to provide the push-pull operation of amplifying devices 16 and 18 as previously described herein above. Output signal inverting transformer 38 provides the in-phase combining of the output signals at output terminal 12 from output line segments 34 and 36 as previously described herein above. The basic operation of a distributed amplifier with multiple input lines is well known in the art. The improvement provided by the present invention is that the present invention provides push-pull operation of a distributed amplifier with multiple input lines. The push-pull operation results in improved distortion performance, higher efficiency, and higher output power over that provided by a distributed amplifier of the prior art with multiple input lines. The performance of the embodiment of the amplifier shown in FIG. 2 with identical input signals is substantially similar to that of the embodiment of the amplifier shown in FIG. 1 and previously described herein above.

For simplicity, the embodiment of FIG. 2 is shown with a single signal inverting transformer 38 in output line 26. Alternately, multiple signal inverting transformers 38 may be included in the output line 26 interconnected between various amplifying devices 16 and 18. Additionally, embodiments of the present invention comprising multiple input lines may include one or more signal inverting transformers 32 in one or more of the multiple inputs.

The embodiment of FIG. 2 utilizes signal inverting transformer 32 and signal delays 54 and 58 as integral elements of the amplifier system. With this configuration, each of the required individual input signals would normally be similar in phase, delay and amplitude, although the various input signals may be made different to provide performance in applications that will become apparent by practice of the invention. Equal multiple input signals may be provided from a single source by means of a simple parallel connection of all of the inputs. Alternately, the multiple input signals and necessary relative signal inversion and signal delay required with multiple inputs may be provided by various other means as referenced herein above. An example of another means for providing the required signal inversion and signal delay for an embodiment comprising two input lines, as that of FIG. 2, is a preamplifier with two outputs of opposed phase and specific signal delay. Such a preamplifier may be utilized to supply the input signals to embodiments substantially similar to that of FIGS. 2 but with the signal inverting transformer 32 and signal delay 54 and 58 deleted.

Figure 3:
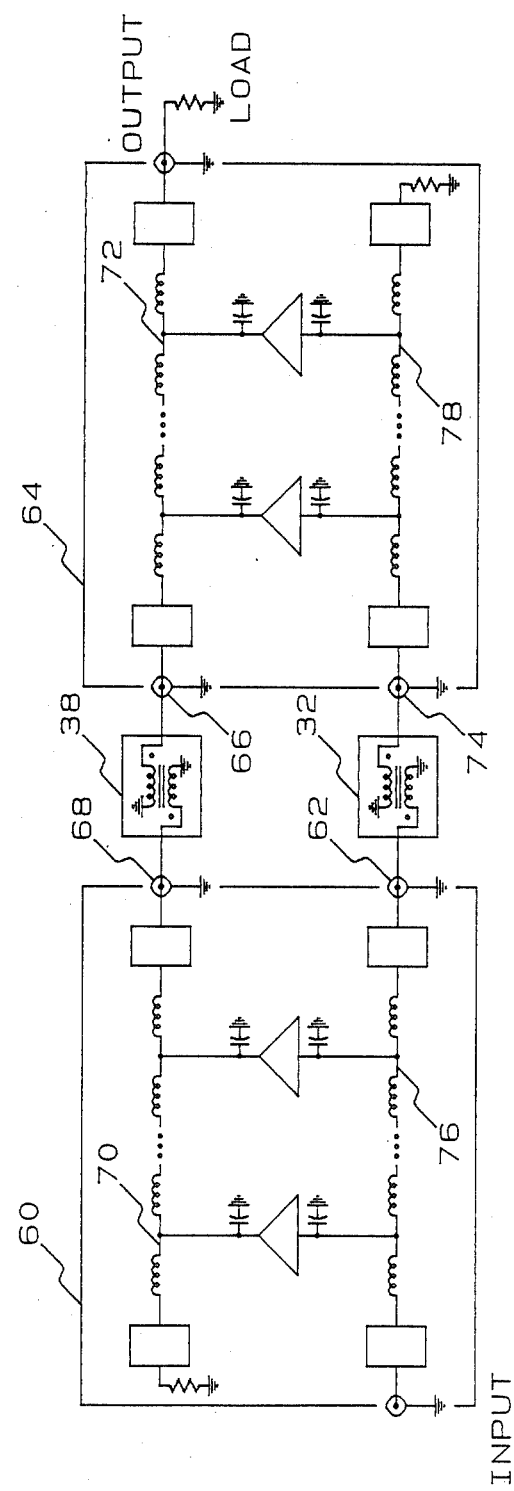
FIG. 3 is a schematic diagram showing a variation of the push-pull distributed amplifier system of the present invention utilizing two independent distributed amplifiers.

It is further apparent to one skilled in the art that the embodiment shown in FIG. 1 may be comprised of several independent distributed amplifiers. A configuration according to the invention comprised of two independent substantially similar distributed amplifiers is shown in FIG. 3. With reference to FIG. 3, amplifier 60 is a distributed amplifier but with a connection means 62, an example type of which is a coaxial connector, added and the input line termination normally connected at the point of connection means 62 deleted, and amplifier 60 being otherwise unmodified. Amplifier 64 is a distributed amplifier but with a connection means 66 added and the output line reverse termination normally connected at the point of connection means 66 deleted, and amplifier 64 being otherwise unmodified.

Output signal inverting transformer 38 is interconnected between the output terminal 68 of amplifier 60 and connection means 66 of amplifier 64. The combined assemblage comprised of the output line 70, signal inverting transformer 38 and output line 72 form a composite output line substantially similar to, with reference to FIG. 1, that formed by output line segment 34, signal inverting transformer 38 and output line segment 36 previously described herein above. A composite line as referenced herein is understood to be a substantially complete lumped-element transmission line comprised of two are more individual lumped-element transmission lines, with one or more terminating means deleted, connected together so as to form one continuous, substantially complete lumped-element transmission line.

With reference to FIG. 3, input line signal inverting transformer 32 is interconnected between input terminal 74 of amplifier 64 and connection means 62 of amplifier 60. The combined assemblage comprised of input line 76, signal inverting transformer 32 and input line 78 form a composite input line substantially similar to, with reference to FIG. 1, that formed by input line segment 28, signal inverting transformer 32 and input line segment 30 previously described herein above.

The electrical configuration of the amplifier shown in the embodiment of FIG. 3 is therefore substantially similar to the embodiment shown in FIG. 1 although the physical configurations differ. The electrical configurations being similar, the operation of the amplifier of embodiment of FIG. 3 is identical to that previously described herein above for the embodiment of FIG. 1.

For simplicity, the embodiment of FIG. 3 is shown with only two independent distributed amplifiers. Alternately, more than two independent distributed amplifiers may be incorporated and with one or more signal inverting transformers 32 and one or more signal inverting transformers 38 included.

Figure 4:
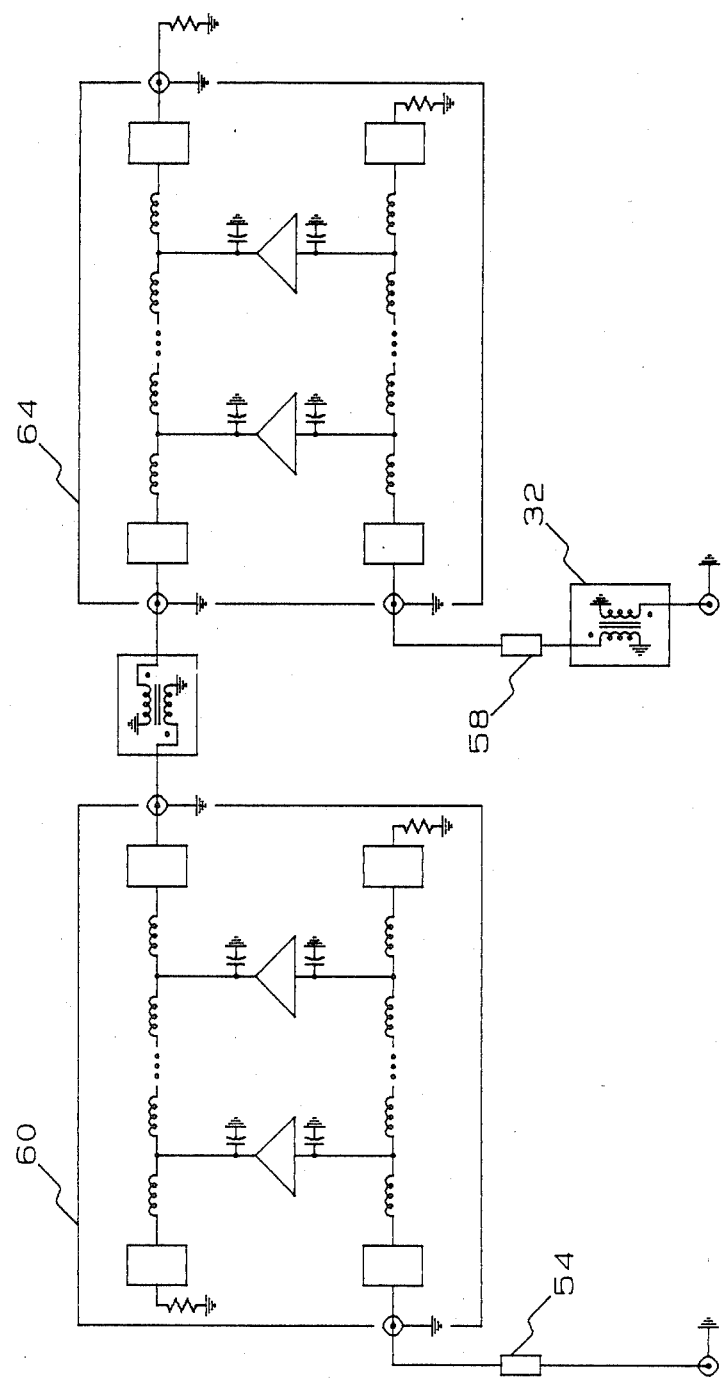
FIG. 4 is a schematic diagram showing a variation of the push-pull distributed amplifier system of the present invention utilizing two independent distributed amplifiers and with independent input lines.

It further follows that multiple distributed amplifiers may be incorporated with independent input signals. FIG. 4 of the included drawings shows a configuration according to the invention comprising two independent distributed amplifiers 60 and 64 and with independent inputs. The electrical performance of the configuration shown in FIG. 4 is identical to that previously discussed herein above with reference to FIG. 2.

The embodiment of FIG. 4 utilizes signal inverting transformer 32 and signal delays 54 and 58 as integral elements of the amplifier system. Alternately, the multiple input signals and necessary relative signal inversion and signal delay required with multiple inputs may be provided by various other means as referenced herein above.

Figure 5:
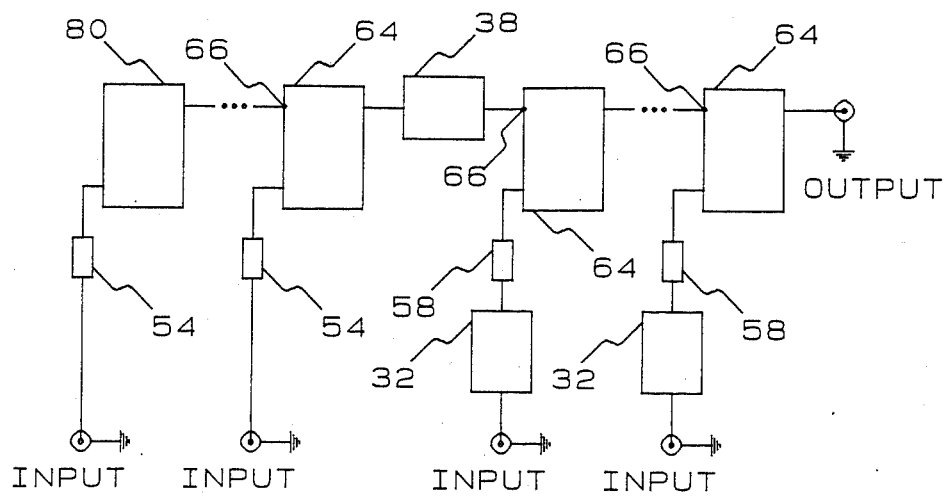
FIG. 5 is a schematic diagram showing a variation of the push-pull distributed amplifier system of the present invention utilizing multiple independent distributed amplifiers each with independent input lines.

Since the present invention allows the use of several individual distributed amplifiers, various different interconnections of the individual distributed amplifiers may be made to optimize performance in applications that will become apparent by practice of the invention. One such application is selective distortion as referenced herein above. FIG. 5 of the included drawings shows a distributed amplifier system according to the present invention comprised of several individual distributed amplifiers with independent input lines for each individual distributed amplifier. Distributed amplifier 80 is a substantially standard distributed amplifier as referenced herein above. Amplifiers 64 are distributed amplifiers but with connection means 66 added and the output reverse termination normally connected at the point of connection means 66 deleted and distributed amplifiers 64 being otherwise unmodified as referenced herein above. The output lines of the individual distributed amplifiers 64 and 80 are interconnected so as to form a single composite output line as referenced herein above. Output signal inverting transformer 38 is interconnected in the composite output line between two adjacent individual distributed amplifiers 64 and 80. For simplicity, FIG. 5 is shown with only one signal inverting transformer 38, but alternately more than one signal inverting transformer 38 may be interconnected between additional adjacent distributed amplifiers 64 and 80. When a single inverting transformer 38 is used, it may be placed between any pair of adjacent individual distributed amplifiers 64 and 80. Input signal inverting transformers 32 and signal delays 54 and 58 are included in the embodiment of FIG. 5 to provide the required input signal inversion and delay required for proper operation of the amplifier system. The multiple input signals may be supplied from a single source by connecting all of the individual inputs together in parallel as previously referenced herein. Alternately, the required input signal inversion and delay may be provided by other means, such as a preamplifier with suitable multiple outputs, with signal inverting transformers 32 and signal delays 54 and 58 deleted as referenced herein above. The operation of the embodiment of FIG. 5 is substantially similar to that of FIG. 4 and previously referenced herein.

Figure 6:
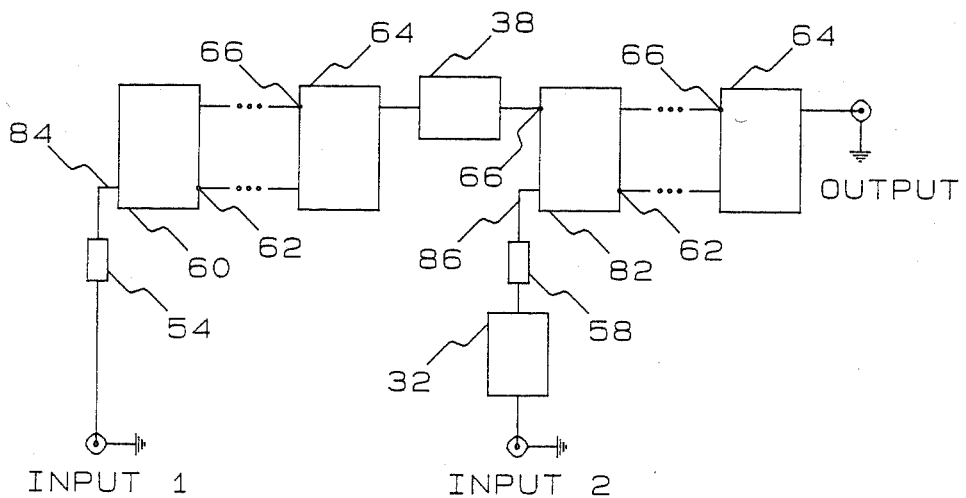
FIG. 6 is a schematic diagram showing a variation of the push-pull distributed amplifier system of the present invention utilizing multiple independent distributed amplifiers with two composite input lines.

Further, when the present invention is configured with multiple individual distributed amplifiers, the input lines may be interconnected to form one or more composite input lines. An embodiment of the present invention comprising several individual distributed amplifiers and two composite input lines is shown in FIG. 6. With reference to FIG. 6, distributed amplifier 60 is a distributed amplifier but modified by the addition of connection means 62 and deletion of input line termination as previously referenced herein. Distributed amplifiers 64 are distributed amplifiers but modified by the addition of connection means 66 and deletion of output line reverse terminations as previously referenced herein. Distributed amplifier 82 is a distributed amplifier but with connection means 62 added and the input line termination normally connected at the point of connection of connection means 62 deleted, and connection means 66 added and output line reverse termination normally connected at the point of connection of connection means 66 also deleted. The output lines of the individual distributed amplifiers 60, 64, and 82 are interconnected to form a single composite output line as referenced herein above. The input lines of the individual distributed amplifiers are interconnected to form two composite input lines 84 and 86. Input signal inverting transformer 32 and delays 54 and 58 are included in the embodiment of FIG. 6 to provide the required input signal inversion and delay required for proper operation of the amplifier system as previously referenced herein. Alternately, any of the means previously referenced herein of providing multiple input signals may also be used. The operation of the embodiment of FIG. 6 is substantially similar to that of FIG. 4 and previously referenced herein. For simplicity, a single output signal inverting transformer 38 is shown in the embodiment of FIG. 6. When a single inverting transformer 38 is used, it may be placed between any pair of adjacent individual distributed amplifiers 60, 64, and 82. Alternately, more than one signal inverting transformer 38 may be interconnected between additional adjacent distributed amplifiers 60, 64, and 82.

Figure 7:
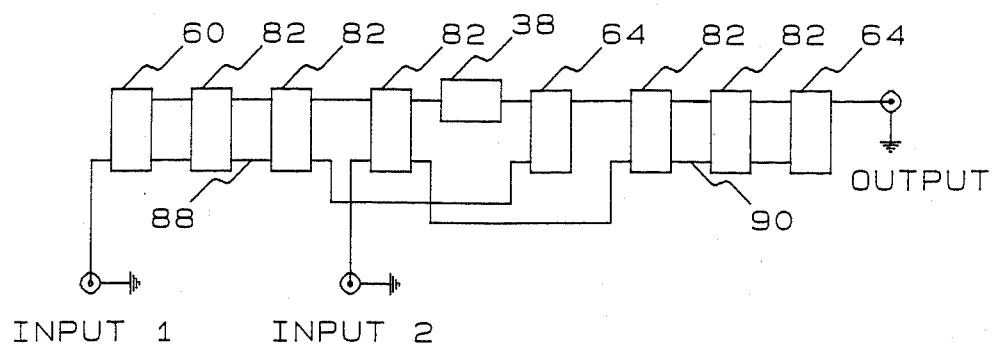
FIG. 7 is a schematic diagram showing a variation of the push-pull distributed amplifier system of the present invention utilizing multiple independent distributed amplifiers with cross-coupled inputs.

Further, when the present invention is configured with multiple individual distributed amplifiers, the individual amplifiers may be interconnected in a cross-coupled manner. An embodiment of the present invention comprising several individual distributed amplifiers and further comprising a cross-coupled input connection is shown in FIG. 7. With reference to FIG. 7, individual distributed amplifiers 60, 64 and 82 are substantially standard distributed amplifiers but modified as referenced herein above. The output lines of the individual distributed amplifiers are interconnected so as to form a single composite output line as previously referenced herein. The input lines of the individual distributed amplifiers are interconnected so as to form two independent composite input lines 88 and 90. Each composite input line 88 and 90 interconnects several individual distributed amplifiers on one side of inverting transformer 38 and at least one individual distributed amplifier on the other side of inverting transformer 38. As previously referenced herein, such cross-coupling provides a means of accurate control of the distortion characteristics of the amplifier system of the present invention in applications that will become apparent by practice of the invention. When a single signal inverting transformer 38 is incorporated, it may be placed interconnected between any pair of adjacent individual distributed amplifiers 60, 64, and 82. Further, more than one signal inverting transformer 38 may be included, and similarly more than two independent composite input lines may be used. The required multiple input signals required may be provided by various means as previously referenced herein. The operation of the embodiment of FIG. 7 is substantially similar to that of FIG. 4 connected with cross-coupling as referenced herein above.

It will be apparent to those skilled in the art that modifications and variations can be made to the push-pull amplifier of the invention. The invention in its broader aspects is therefore not limited to the specific details, representative methods and apparatus and illustrative examples shown and described herein above. Thus, it is intended that all manner contained in the foregoing description or shown in the accompanying drawings shall be interpreted as illustrative and not in a limiting sense, and the invention is intended to encompass all such modifications and variations as fall within the scope of the appended claims.

We claim:

1. A distributed amplifier system comprising:
   a. at least one input line;
   b. an output line;
   c. at least two amplifying means; and
   d. at least one output signal inverting means
wherein an input terminal of each said amplifying means is connected to said input line, and an output terminal of each said amplifying means is connected to said output line, and said output signal inverting means is interconnected into said output line between at least one pair of adjacent said amplifying means.

2. A distributed amplifier, as recited in claim 1, further comprising one said input line and at least one input signal inverting means wherein said input signal inverting means is interconnected into said input line between at least one pair of adjacent said amplifying means.

3. A distributed amplifier system, as recited in claim 2, wherein there is an even number of said amplifying means, and wherein said input signal inverting means is interconnected into said input line between said amplifying means such that there is an equal number of said amplifying means on said input line on either side of said input signal inverting means, and wherein said output signal inverting means is interconnected into said output line such that there is and equal number of said amplifying means on said output line on either side of said output signal inverting means.

4. A distributed amplifier system, as recited in claim 1, further comprising:
   a. at least one input signal inverting means; and
   b. at least one signal delay means
wherein said input signal inverting means is connected to at least one of said input lines and said signal delay means is connected to at least one of said input lines.

5. A distributed amplifier system, as recited in claim 4, further comprising two said input lines and an even number of said amplifying means; wherein each of said input lines is connected to one-half of said even number of amplifying means; and wherein said output signal inverting means is interconnected into said output line such that there is an equal number of said amplifying means on either side of said output signal inverting means.

6. A distributed amplifier system comprising:
   a. at least two distributed amplifiers with each of said distributed amplifiers further comprising an input terminal connected to an input line and an output terminal connected to an output line, a plurality of amplifying means, matching means, signal delay means, and forward and reverse terminating means;
   b. output line connecting mans; and
   c. at least one output signal inverting means
wherein said output line connecting means replaces an output line reverse termination means on all but one of said distributed amplifiers; and wherein said individual output lines of said distributed amplifiers are interconnected so as to form a single composite output line; and wherein said output signal inverting means is interconnected into said composite output line between at least one pair of adjacent said distributed amplifiers.

7. A distributed amplifier system, as recited in claim 6, further comprising:
   a. input line connecting means; and
   b. at least one input signal inverting means
wherein said input line connecting means replaces an input line forward termination means on all but one of said distributed amplifiers; and wherein said input lines of said distributed amplifiers are interconnected so as to form a single composite input line; and wherein said input signal inverting means is interconnected into said composite input line between at least one pair of adjacent said distributed amplifiers.

8. A distributed amplifier system, as recited in claim 7, further comprising one said input signal inverting means and one said output signal inverting means; and wherein there is an even number of said distributed amplifiers; and wherein said input signal inverting means is interconnected into said composite input line such that there is an equal number of said distributed amplifiers on either side of said input signal inverting means; and wherein said output signal inverting means is interconnected into said composite output line such that there is an equal number of said distributed amplifiers on either side of said output signal inverting means.

9. A distributed amplifier system, as recited in claim 6, further comprising:
   a. at least one input signal inverting means; and
   b. at least one signal delay means
wherein said input signal inverting means is connected to the input of at least one said distributed amplifier; and said signal delay means is connected to the input of at least one said distributed amplifier.

10. A distributed amplifier system, as recited in claim 6, further comprising an input line connecting means; and wherein said input line connecting means replace forward termination means on one or more of said distributed amplifiers; and wherein said input lines of said distributed amplifiers are interconnected so as to form two or more independent composite input lines.

11. A distributed amplifier system, as recited in claim 10, further comprising:
 a. at least one input signal inverting means; and
 b. at least one signal delay means
wherein said input signal inverting means is connected to at least one of said composite input lines; and said signal delay means is connected to at least one of said composite input lines.

12. A distributed amplifier system, as recited in claim 11, further comprising an even number of said distributed amplifiers and two said composite input lines; and wherein each said composite input line comprises the interconnection of said input lines of one-half of the total number of said distributed amplifiers.

13. A distributed amplifier system, as recited in claim 12, further comprising a single said output signal inverting means; and wherein said output signal inverting means is interconnected into said output line such that there is an equal number of said distributed amplifiers on either side of said output signal inverting means.

14. A distributed amplifier system, as recited in claim 13, further comprising:
 a. an input signal inverting means; and
 b. at least one signal delay means;
wherein said input signal inverting means is connected to one of said composite input lines; and said signal delay means is connected to at least one of said composite input lines; and wherein all of said distributed amplifiers connected to one of said composite input lines are on one side of said output signal inverting means; and all of said distributed amplifiers connected to the other of said composite input lines are on the other side of said output signal inverting means.

* * * * *